United States Patent
Nahas et al.

(10) Patent No.: US 6,859,388 B1
(45) Date of Patent: Feb. 22, 2005

(54) CIRCUIT FOR WRITE FIELD DISTURBANCE CANCELLATION IN AN MRAM AND METHOD OF OPERATION

(75) Inventors: Joseph J. Nahas, Austin, TX (US); Thomas W. Andre, Austin, TX (US); Chitra K. Subramanian, Austin, TX (US)

(73) Assignee: Freescale Semiconductor, Inc., Austin, TX (US)

(*) Notice: Subject to any disclaimer, the term of this patent is extended or adjusted under 35 U.S.C. 154(b) by 0 days.

(21) Appl. No.: 10/656,646

(22) Filed: Sep. 5, 2003

(51) Int. Cl.⁷ ............................................. G11C 11/00
(52) U.S. Cl. ........................ 365/158; 365/171; 365/173
(58) Field of Search ................................ 365/158, 171, 365/173

(56) References Cited

U.S. PATENT DOCUMENTS

| | | | |
|---|---|---|---|
| 6,097,626 A | 8/2000 | Brug et al. | |
| 6,545,906 B1 | 4/2003 | Savtchenko et al. | |
| 6,577,527 B2 * | 6/2003 | Freitag et al. | 365/158 |
| 6,611,454 B2 * | 8/2003 | Hidaka | 365/171 |
| 6,661,071 B2 * | 12/2003 | Lenssen et al. | 257/422 |
| 2002/0085411 A1 | 7/2002 | Freitag et al. | |
| 2002/0135018 A1 * | 9/2002 | Hidaka | 257/359 |
| 2003/0174536 A1 * | 9/2003 | Hidaka | 365/158 |
| 2004/0001353 A1 * | 1/2004 | Hidaka | 365/171 |

FOREIGN PATENT DOCUMENTS

EP      1 202 284 A2      5/2002

OTHER PUBLICATIONS

U.S. patent application 10/656,676.

* cited by examiner

Primary Examiner—Son Mai
(74) Attorney, Agent, or Firm—Robert L. King; Micheal Balconi-Lamic

(57) ABSTRACT

A circuit and method for counteracting stray magnetic fields generated by write currents in an MRAM memory reuses the write current in adjoining write columns via a current redistribution bus at a first end of the write lines. A first switch connected to a second end of each write line controls the write current in the write line. If the first switch is not conductive, a second switch connects the second end of the write line to a reference voltage terminal. For write lines located at sub-array edges, a predetermined amount of spacing may be used to avoid magnetic field disturbance in an adjacent sub-array. The number of spaces required can be minimized by specific activation of write line switches.

31 Claims, 4 Drawing Sheets

US 6,859,388 B1

CIRCUIT FOR WRITE FIELD DISTURBANCE CANCELLATION IN AN MRAM AND METHOD OF OPERATION

RELATED APPLICATION

This application is related to:

U.S. patent application Ser. No. 10/656,676 entitled "Write Driver For A Magnetoresistive Memory" by Nahas et al. filed simultaneously herewith, and assigned to the assignee hereof.

FIELD OF THE INVENTION

This invention relates generally to semiconductor circuits, and more specifically, to semiconductor memory circuits.

BACKGROUND OF THE INVENTION

Magnetoresistive random access memories (MRAMs) have certain beneficial characteristics such as being non-volatile, dense, and fast. These characteristics have made it very attractive for use as both a general purpose memory and as an embedded memory, i.e., a memory on-board a logic circuit such as a microcomputer. Putting such MRAMs into production has been difficult due to a number of factors. One of these is being able to consistently write a one and a zero that can be identified as such.

One technique for overcoming is the development of a toggle bit MRAM. Such is described in U.S. Pat. No. 6,545,906 B1, Savtchenko et al. In this case the MRAM is programmed by applying two timed magnetic signals so that the MRAM cell switches state regardless of its present state. A change from a logic one to a logic zero is achieved in the same way as a change from a logic zero to a logic one. This technique provides excellent consistency in writing both the logic one state and the logic zero state into the bit. Because the toggling of logic states is achieved by controlling the magnetic field in a bit, it is current in the write lines that create magnetic fields that must be controlled. Unfortunately, magnetic fields created by a particular write line current are not confined to the immediate vicinity of the write line. A portion of the magnetic field for a particular write line current can encroach on bits associated with neighboring write lines. These stray magnetic fields can cause erroneous toggling of bits associated with these neighboring write lines. Magnetic fields may be influenced by current conduction and the direction thereof.

BRIEF DESCRIPTION OF THE DRAWINGS

The present invention is illustrated by way of example and is not limited by the accompanying figures, in which like references indicate similar elements.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

Figure 1:
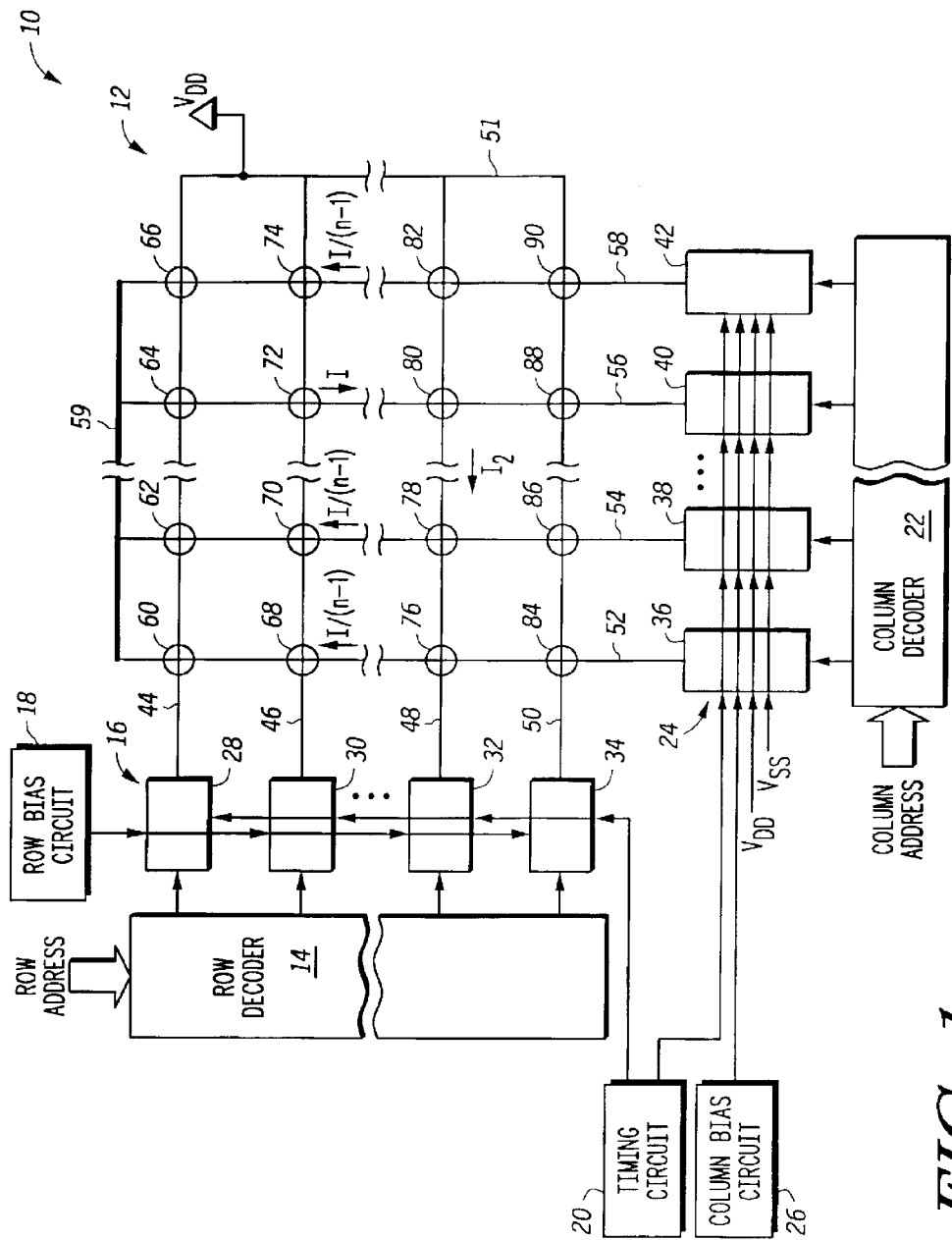
FIG. 1 illustrates in block diagram form an MRAM architecture with write field disturbance cancellation in accordance with a first form of the present invention.

Illustrated in FIG. 1 is a memory 10 having an array 12 of magnetoresistive memory (MRAM) cells, a row decoder 14 for receiving a row address, a plurality of row write drivers 16 coupled to row decoder 14, a row bias circuit 18 coupled to the row write drivers 16, a timing circuit 20 coupled to the row write drivers 16, a column decoder 22 for receiving a column address, a plurality of column write drivers 24 coupled to column decoder 22 and timing circuit 20, and a column bias circuit 26 coupled to the column write drivers 24. A positive power supply voltage, $V_{DD}$, and a lower potential power supply voltage, $V_{SS}$, are each connected to the column write drivers 24. The $V_{SS}$ power supply voltage is typically reference ground. Array 12 comprises row write conductors or row write lines 44, 46, 48, and 50, column write conductors or column write lines 52, 54, 56, and 58, and MRAM memory cells 60, 62, 64, 66, 68, 70, 72, 74, 76, 78, 80, 82, 84, 86, 88, and 90. Plurality of row write drivers 16 comprise row write driver 28, which is coupled to a first end of row write line 44, row write driver 30, which is coupled to a first end of row write line 46, row write driver 32, which is coupled to a first end of row write line 48, and row write driver 34, which is coupled to a first end of row write line 50. The second ends of row write lines 44, 46, 48 and 50 are connected together at a node 51 that is a $V_{DD}$ power supply bus that is connected to the $V_{DD}$ power supply voltage. Plurality of column write drivers 24 comprise column write driver 36, which is coupled to a first end of column write line 52, column write driver 38, which is coupled to a first end of column write line 54, column write driver 40, which is coupled to a first end of column write line 56, and column write driver 42, which is coupled to a first end of column write line 58. The second ends of each of column write lines 52, 54, 56 and 58 are joined together by a column write current redistribution bus 59.

It should be understood that in practice, memory 10 would include many more memory cells as well as other features such as address buffers, word lines and bit lines for reading, sense amplifiers for reading, input buffers for receiving data to be written, and output buffers. Further, it should be understood that while a column write operation is discussed, the description herein applies equally to row write operations wherein a write operation to a row conductor or row line is analogous to a write operation to a column conductor or column line.

In the operation of memory 10, memory cells 60–90 are MRAM cells that are written (programmed) by toggling. In this case a particular memory cell, such as memory cell 80 is written by overlapping write pulses. Whether the current is applied to column write line 56 or row write line 48 first is somewhat arbitrary because the cell can be effectively written either way. Which of these is optimum may be more related to the amount of disturb on adjacent cells and other factors. Assuming in this case that current is applied in the row direction first, a current pulse is applied to row write line 48 by row write driver 32 while no current is applied to column write line 56 by column write driver 40. This timing is controlled by timing circuit 20. The current magnitude is controlled by row bias circuit 18. While row write driver 32 is still applying the current pulse to row write line 48, a current pulse is applied to column write line 56 by column write driver 40. The magnitude of the current of this current pulse is controlled by column bias circuit 26. While column write driver 40 is applying the current pulse to column write line 56, row write driver 32 terminates the current pulse applied to row write line 48. After the current pulse applied to row write line 48 has been terminated, the pulse applied to column write line 56 is terminated. This completes the toggling of the state of memory cell 80.

The just described programming operation of memory cell 80 creates a magnetic disturbance of adjoining memory cells 78 and 82 due to stray magnetic fields from the current, I, flowing through column write line 56.

Figure 2:
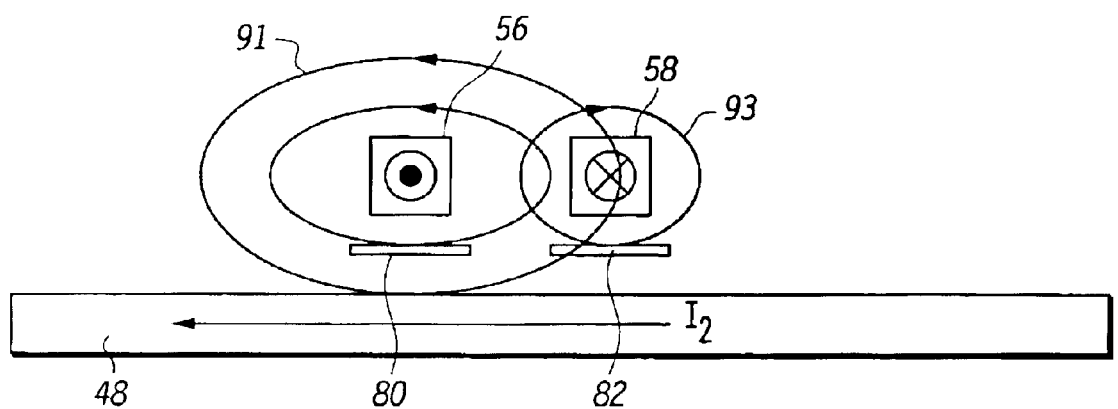
FIG. 2 illustrates in cross-sectional form magnetic field distribution associated with two memory cells of the memory of FIG. 1.

Illustrated in FIG. 2 are the magnetic fields associated with the programming of memory cell 80. Row write line 48 underlies both memory cell 80 and memory cell 82 and is conducting a write word line current illustrated as $I_2$. Column write line 56 overlies row write line 48 and memory cell 80. Column write line 56 conducts the current I. The current I creates a magnetic field 91 that is illustrated counter-clockwise in direction assuming the current is conducted out of the illustration. Note that the magnetic field 91 encroaches on memory cell 82 (and also memory cell 78-not illustrated). Referring back to FIG. 1, column write driver 40 drives the current I through column write line 56. The second end of column write line 56 is connected at column write current redistribution bus 59 to the second ends of column write lines 52, 54 and 58. Column write drivers 36, 38 and 42 respectively connect column write lines 52, 54 and 58 to the $V_{DD}$ power supply voltage. The current I in column write line 56 is divided into the remaining columns connected to column write current redistribution bus 59 so that each of the remaining columns conducts a current of [I/(n−1)] where n is the total number of column write lines connected to column write current redistribution bus 59. Note that the current in column write line 58, I/(n−1), flows in the opposite direction as the current in column write line 56. The fields 93 generated by the current in column write line 58 is illustrated in FIG. 2. The fields 93 counteract the stray field from column write line 56. Note that normally the second ends of the column write lines are connected to the power supply $V_{DD}$. In contrast, in the illustrated form, the write current I is redistributed via column write current redistribution bus 59 in a reverse direction in non-selected column write lines thereby reusing the current to counteract stray magnetic fields.

It should be noted that using a toggle MRAM cell taught by Savtchenko et al., the current used to counteract stray magnetic fields will not themselves cause a disturbance of the state of a memory cell. Due to the rotational nature of the MRAM cell taught by Savtchenko et al., such memory cells are inherently immune from disturbances caused by these currents because these currents create magnetic fields that fall solidly within a no-switching region and do not permanently alter the magnetic state. For common instantiations of MRAM memory structures, the counteracting magnetic fields would have to be controlled to avoid negative effects.

Figure 3:
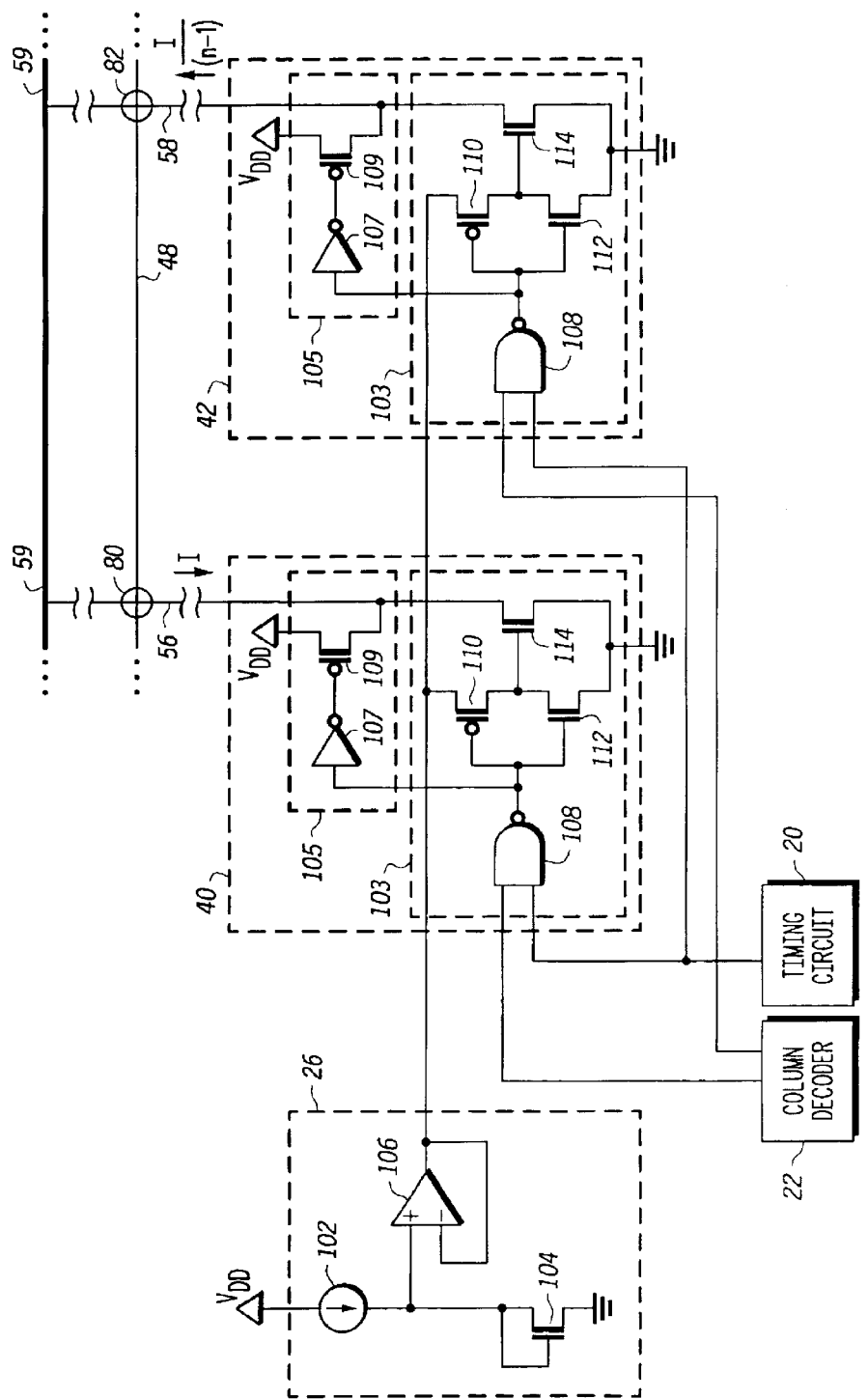
FIG. 3 illustrates in partial schematic diagram form two column write drivers of the FIG. 1 memory and associated circuitry.

Illustrated in FIG. 3 are memory cells 80 and 82 of FIG. 1, column write drivers 40 and 42, column bias circuit 26, column decoder 22, and timing circuit 20. Column bias circuit 26 and column write drivers 40 and 42 are shown as circuit diagrams. Column bias circuit 26 has a current source 102, an N channel transistor 104, and a unity gain amplifier 106. Current source 102 has a first terminal connected to the positive $V_{DD}$ power supply terminal and a second terminal. Current flows from the first terminal to the second terminal. Transistor 104 has a control electrode and a first current electrode (drain in this case) connected to the second terminal of the current source and a second current electrode coupled to a power supply terminal, in this case, ground.

Unity gain amplifier 106 has a first input connected to the second terminal of current source 102 and an output connected to a second input thereof. This output of unity gain amplifier 106 is the output of column bias circuit 26 and is coupled to the column write drivers, including column write drivers 40 and 42 as illustrated in FIG. 1. Unity gain amplifier 106 in this example is achieved by an operational amplifier in which the non-inverting input is connected to the second terminal of current source 102 and the inverting input is coupled to the output of the operational amplifier. Transistor 104, in the well-understood current mirror configuration, establishes a bias voltage useful for establishing a current through another transistor that is directly proportional to the current through transistor 104. The ratio of the currents is well understood to be based on the ratio of the size of transistor 104 to that of the other transistor that receives the bias voltage. This bias voltage is buffered by unity gain amplifier 106 because the bias voltage is also received by many other write drivers. The number of column write drivers is generally going to be a relatively large number.

Column write drivers 40 and 42 are preferably implemented with the same circuitry. Each of column write drivers 40 and 42 has a first switch 103 and a second switch 105. First switch 103 has a NAND gate 108, a P-channel transistor 110, an N-channel transistor 112, and an N-channel transistor 114. NAND gate 108 has a first input coupled to the output of column decoder 22, a second input coupled to a first output of timing circuit 20, and an output.

Transistor 110 has a gate (control electrode) coupled to the output of NAND gate 108, a source coupled to the output of unity gain amplifier 106, and a drain. Transistor 112 has a gate coupled to the output of NAND gate 108, a drain coupled to the drain of transistor 110, and a source connected to the ground reference power supply terminal. Transistor 114 has a control electrode connected to the drains of transistors 110 and 112, a drain connected to column write line 56 for column write driver 40 or to column write line 58 for column write driver 42, and a source connected to the ground reference power supply terminal. Transistor 114 is significantly larger than transistor 104. The channel lengths are preferably the same with the channel width of transistor 114 being significantly larger than that of transistor 104. Second switch 105 is formed by an inverter 107 and a P-channel transistor 109. An input of inverter 107 is connected to the output of NAND gate 108. An output of inverter 107 is connected to a gate of transistor 109. The source of transistor 109 is connected to the $V_{DD}$ power supply voltage terminal and the drain of transistor 109 is connected to either column write line 56 for column write driver 40 or to column write line 58 for column write driver 42. Memory cell 80 is formed at the intersection of column write line 56 and row write line 48. Memory cell 82 is formed at the intersection of column write line 58 and row write line 48. Column write line 56 and column write line 58 are connected together by the column write current redistribution bus 59.

In operation, when column write line 56 is selected, column decoder 22 outputs a logic high to NAND gate 108 of column write driver 40. Timing circuit 20 provides a positive going pulse at the time current is to be supplied through column write line 56. The application of the logic high by the pulse from timing circuit 20 causes NAND gate 108 of column write driver 40 to output a logic low that causes transistor 110 of column write driver 40 to become conductive. Meanwhile, column decoder 22 continues to provide a logic low to NAND gate 108 of column write driver 42. The output of NAND gate 108 of column write driver 42 stays in the high state. The output of inverter 107 of column write driver 42 stays in the low state continuing to activate transistor 109 of column write driver 42.

Transistor 110 of column write driver 40 operates as a switch that couples the output of unity gain amplifier 106 to the gate of transistor 114 of column write driver 40. Transistor 114 of column write driver 40 becomes conductive with a gate voltage that controls the current through transistor 114 of column write driver 40. The current is controlled in the familiar current mirror fashion in which the current through transistor 104 is reflected to transistor 114 of column write driver 40 via unity gain amplifier 106 and transistor 110 of column write driver 40.

The current in transistor 114 of column write driver 40 is sourced through column write line 56 from the column write current redistribution bus 59.

Transistor 109 of column write driver 42 couples column write current redistribution bus 59 to the $V_{DD}$ power supply terminal through column write line 58 as do the other similar column write drivers coupled to column write current redistribution bus 59. If n write lines are connected to column write current redistribution bus 59, then the current in column write line 56 is distributed into (n−1) portions typically resulting in a current of [/(n−1)] in column write line 58.

When it is time to terminate the current through write line 56, timing circuit 20 terminates the pulse so that NAND gate 108 of column write driver 40 switches its output to a logic low causing transistor 112 of column write driver 40 to be conductive and transistor 110 of column write driver 40 to be non-conductive. With transistor 112 of column write driver 40 conductive, the gate of transistor 114 of column write driver 40 is coupled to its source causing it be non-conductive and thereby terminating the write current through column write lines 56 and 58.

Column decoder 22 provides a logic low output to all of the column write drivers that are deselected. Thus the signal from column decoder 22 that is associated with column write line 56 is brought to a logic low when column write line 56 is deselected. This keeps the output of NAND gate 108 of column write driver 40 at a logic high, which causes transistor 112 of column write driver 40 to be conductive and transistor 110 of column write driver 40 to be non-conductive. In that condition, transistor 114 of column write driver 40 has its gate coupled to its source and is thereby non-conductive. It should be understood that first switch 103 controlling the write current can be implemented with various other structures than that illustrated in FIG. 3. For example, it may be implemented with a current source in series with a switch rather than a single transistor performing both functions.

Figure 4:
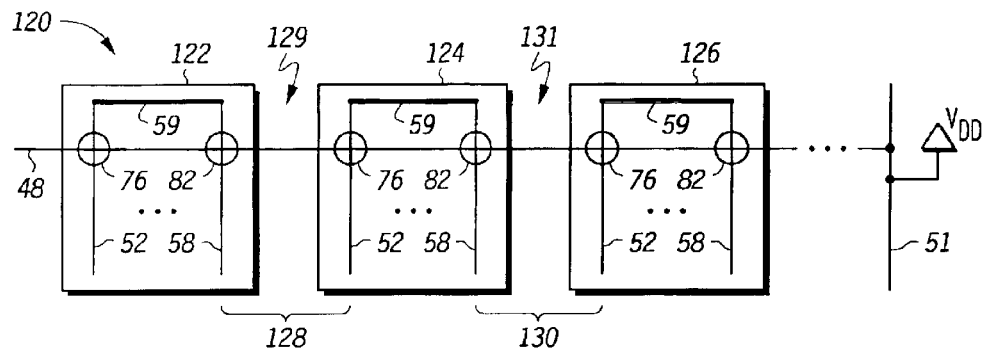
FIG. 4 illustrates in diagramatic form a spatial layout of the memory of FIG. 1.

Illustrated in FIG. 4 is a diagram of a layout of an MRAM memory 120 using the magnetic field disturbance compensation discussed herein. In particular, MRAM memory 120 has a plurality of sub-arrays, such as sub-array 122, 124 and 126. Each of the sub-arrays has a plurality of column write lines and row write lines whereby a memory cell is formed at the intersection of each column write line and row write line. For example, sub-array 122 has column write lines such as column write lines 52 and 58, and has row write lines such as the row write line 48. Memory cells 76 and 82 are two of the numerous memory cells in sub-array 122. Similarly, sub-arrays 124 and 126 have memory cells 76 and 82 respectively formed by column write lines 52 and 58 and row write line 48. In each sub-array the column write current redistribution bus 59 is connected to an end of each column write line. An end of each column word line passing through sub-arrays 122, 124 and 126 is connected at node 51 to $V_{DD}$.

The layout of memory 120 further compensates for the write disturbance that exists in surrounding column write lines during programming. In particular, if column write lines that are at an edge or periphery of a memory sub-array do not generate a compensation current in a neighboring column write line in another sub-array, then bits at the edge of the neighboring sub-array may be disturbed because of stray magnetic fields. For example, while writing to a column at the right edge of sub-array 122, bits in region 128 might be disturbed by stray magnetic fields. If sub-array 124 were abutted to sub-array 122, then a column at the left edge of sub-array 124 might be disturbed by stray magnetic fields from column write line 58. By using a space 129 between sub-arrays 122 and 124, enough distance is provided to avoid a detrimental effect. Similarly, space 131 is provided in region 130. It should be understood that the term "space" does not preclude the inclusion of a memory line in the space 129.

Such memory cells are typically referred to as "dummy cells" or a dummy column. Actual memory cells may be implemented in these spaces but are not operatively connected with the sub-arrays.

Figure 5:
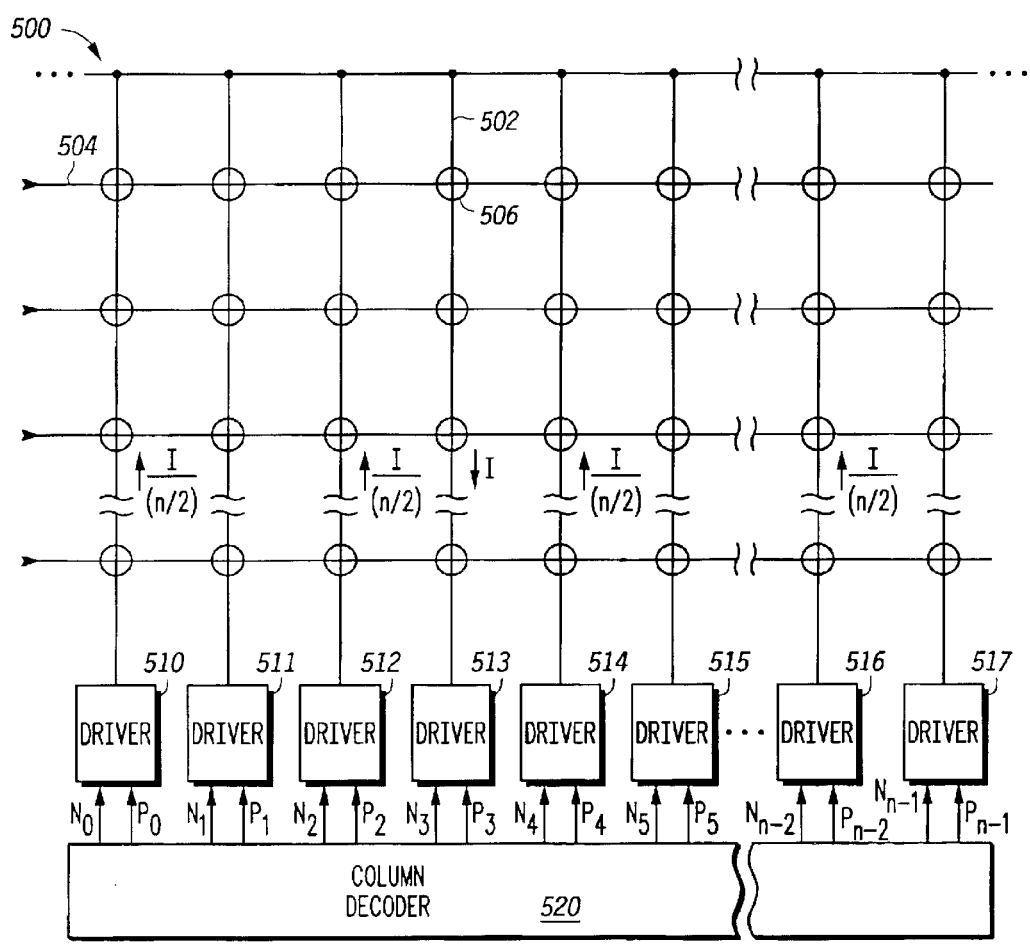
FIG. 5 illustrates in block diagram form another MRAM architecture with write field disturbance cancellation in accordance with another form of the present invention.

Illustrated in FIG. 5 is an alternative form of an MRAM that uses compensation for magnetic field disturbance resulting from a programming operation. An MRAM 500 is formed of an array of memory cells, such as memory cell 506, formed at the intersection of a column write line 502 and a row write line 504. Each column write line is connected to a predetermined one of a plurality of n write driver circuits 510–517, where n is an arbitrary integer that is typically a power of two. Each of the write driver circuits 510–517 has two inputs labeled N and P. The "N" input represents a control signal input for the first switch analogous to switch 103 of FIG. 3, that is an N-channel transistor switch. The "P" input represents a control signal input for the second switch analogous to switch 105 of FIG. 3, that is a P-channel transistor switch. Each of the "P" and "N" control signals is provided by a column decoder 520.

In operation, if an odd numbered column write driver, for example driver circuit 513, is being used to write to memory cell 506 with current I by activating signal N3, then all the even numbered driver circuits P0, P2, P4, etc. are activated. The current I is then divided into (n/2) parts in the active even-numbered columns resulting in a current of [I/(n/2)] or (2I)/n in each column. With this technique the number of columns in a sub-array as discussed in connection with FIG. 3 is doubled, thereby reducing the number of sub-arrays. As a result, the number of spaces between sub-arrays is significantly reduced and the overall size of the memory is reduced.

In addition to the alternative form of FIG. 5, it should be understood that other forms may be used to direct cancellation currents using more sophisticated decoding in the column decoder circuitry. For example, the decoder could be designed to direct the cancellation currents only to a predetermined number of columns neighboring the active column.

By now it should be appreciated that there has been provided an MRAM memory architecture and circuit methods for generating stray magnetic field counteracting currents in lines neighboring the active write line in an MRAM memory. In particular, a write driver circuit has been provided which provides a write current to a write line when writing to a bit on that line. Alternatively, the write driver circuit connects the write line to a power supply voltage terminal so that write currents are sourced at the same side of the array as they are sunk. The write current is divided among other write lines but in a reverse direction to the write current. By including the neighboring write lines in the group of write lines conducting current in the reverse direction, stray magnetic fields are compensated in such neighboring write lines. It should further be understood that reversing the current in the neighboring lines does not itself create disturbing magnetic fields.

In one form there is provided a random access memory of magnetic elements having an array of bit cells. An array of write lines is used in writing to a selected bit cell of said array of bit cells. The array of write lines includes a plurality of column write lines wherein a column write current that is applied to a column write line of a selected bit cell is subject to producing a magnetic field about the corresponding column write line. The magnetic field includes a stray portion thereof that is subject to disturbing a non-selected bit cell of a neighboring column write line. A plurality of column write drivers is coupled to first ends of corresponding ones of the plurality of column write lines wherein at least one column write driver is configured for switching a column write current onto a corresponding column write line in response to selection of a bit cell of the corresponding column write line. The at least one column write dirver is also configured for switching a disturb counteracting current onto the corresponding column write line in response to non-selection of a bit cell associated with the corresponding column write line. The disturb counteracting current includes a recycled portion of the column write current of a neighboring column write line of a selected bit cell. The disturb counteracting current produces a second magnetic field about the corresponding column write line. The second magnetic field is adapted to counteract an effect on a non-selected bit cell of the corresponding column write line due to a stray portion of a magnetic field of a neighboring column write line of a selected bit cell. The second magnetic field is oriented in a direction opposite to that of the magnetic field of the neighboring column write line of the selected bit cell. The disturb counteracting current is a reverse current of a portion of the column write current. The disturb counteracting current does not in itself lead to disturbing of bit cells of other neighboring column write lines. Switching the disturb counteracting current includes selectively switching the disturb counteracting current onto the corresponding column write line. The recycled portion of the column write current is substantially equally divided among the plurality of column write lines minus one. A current redistribution bus is coupled to second ends of corresponding ones of the plurality of the column write lines. The current redistribution bus redistributes the column write current of a first column write line into at least one disturb counteracting current to be distributed among at least one of the plurality of column write lines other than the first column write line. Redistributing the column write current further includes redistributing the same as a function of a proximity to the first column write line. Redistributing among at least one of the plurality of column write lines other than the first column write line is further a function of a desired counteracting effect on the stray portion of the magnetic field. The redistribution is still further a function of at least one selected from the group consisting of immediately adjacent column write lines of non-selected bit cells alone, even numbered ones of adjacent column write lines of non-selected bit cells, and odd numbered ones of adjacent column write lines of non-selected bit cells. The at least one column write driver further includes a first switch and a second switch, the first switch for switching the column write current onto the corresponding column write line in response to the selection of the bit cell of the corresponding column write line, and the second switch for coupling the disturb counteracting current to a same corresponding column write line in response to non-selection of a bit cell associated with the corresponding column write line. A state of the first switch is mutually exclusive of a state of the second switch. A state of the first switch is normally ON or conductive, and wherein responsive to selection of a bit cell on a respective column write line, the first switch turns OFF and the second switch turns ON. The column write current of the column write line of the selected bit cell is divided between a subset of column write lines of non-selected bit cells. The first switch includes a current controlled switch that is a NAND gate coupled to an input of a current mirror. The first switch couples a first power supply voltage to a corresponding column write line. The second switch includes an inverter coupled to a p-type transistor. The second switch couples a second voltage power supply to the corresponding column write line. The first power supply voltage corresponds to a lower voltage potential bus $V_{SS}$ and the second power supply voltage corresponds to a higher voltage potential bus $V_{DD}$. The bit cells include magnetoresistive memory cells.

There has also been provided a method for reducing write field disturb in a random access memory of magnetic elements, where the random access memory includes an array of bit cells and an array of write lines for use in writing to a selected bit cell of the array of bit cells. The array of write lines includes a plurality of column write lines, wherein a column write current is applied to a column write line of a selected bit cell and is subject to producing a magnetic field about a corresponding column write line. The magnetic field includes a stray portion thereof subject to disturbing a non-selected bit cell of a neighboring column write line, and a plurality of column write drivers. The plurality of column write drivers is coupled to first ends of corresponding ones of the plurality of column write lines. At least one column write driver is configured for switching a column write current onto a corresponding column write line in response to selection of a bit cell of the corresponding column write line. The at least one column write driver is also configured for switching a disturb counteracting current onto the corresponding column write line in response to non-selection of a bit cell associated with the corresponding column write line. Switching the disturb counteracting current includes recycling a portion of the column write current of a neighboring column write line of a selected bit cell. A second magnetic field is produced about the corresponding column write line in response to the disturb counteracting current. The second magnetic field is adapted to counteract an effect on a non-selected bit cell of the corresponding column write line due to a stray portion of a magnetic field of a neighboring column write line of a selected bit cell. The disturb counteracting current is a reverse current of a portion of the column write current. Switching the disturb counteracting current includes selectively switching the disturb counteracting current onto the corresponding column write line. A recycled portion of the column write current is substantially equally divided among the plurality of column write lines minus one. A current redistribution bus is coupled to second ends of corresponding ones of the plurality of the column write lines. The current redistribution bus redistributes the column write current of a first column write line into at least one disturb counteracting current to be distributed among at least one of the plurality of column write lines other than the first column write line. The column write current in one form is redistributed the same as a function of a proximity to the first column write line. In another form, the redistributing among at least one of the plurality of column write lines other than the first column write line is a function of a desired counteracting effect on the stray portion of the magnetic field. The column write current of the column write line of the selected bit cell is divided between a subset of column write lines of the non-selected bit cells. As described above, the bit cells include magnetoresistive memory cells.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

In the foregoing specification, the invention has been described with reference to specific embodiments. However, one of ordinary skill in the art appreciates that various modifications and changes can be made without departing from the scope of the present invention as set forth in the claims below. The teachings herein apply to a memory that uses magnetic fields but is not necessarily limited to resistive memories (i.e. magnetoresistive). The teachings herein apply to magnetic core memories and other memory types. For example, the circuit implementation of the decoder circuitry that is used with the memory taught herein may be varied and function in various methods to perform decoding. Although MOSFETs of specific conductivity type are illustrated, it should be well understood that changes in the conductivity type or changes in the type of transistors may be made to implement the interconnect structures. Accordingly, the specification and figures are to be regarded in an illustrative rather than a restrictive sense, and all such modifications are intended to be included within the scope of the present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. The terms "connected" and "coupled" are used interchangeably and are intended to include both a direct connection and a connection via one or more intervening elements.

We claim:

1. A random access memory of magnetic elements comprising:

an array of bit cells;

an array of write conductors for use in writing to a selected bit cell of said array of bit cells, wherein a write current applied to a write conductor of a selected bit cell is subject to producing a magnetic field about the corresponding write conductor, the magnetic field including a stray portion thereof subject to disturbing a non-selected bit cell of a neighboring write conductor; and a plurality of write drivers coupled to first ends of corresponding ones of the plurality of write conductors, wherein at least one write driver is configured as follows: (a) for switching a write current onto a corresponding write conductor in response to selection of a bit cell of the corresponding write conductor; and (b) for switching a disturb counteracting current onto the corresponding write conductor in response to non-selection of a bit cell associated with the corresponding write conductor, the disturb counteracting current including a recycled portion of the write current of a neighboring write conductor of a selected bit cell.

2. The random access memory of claim 1, wherein the disturb counteracting current produces a second magnetic field about the corresponding write conductor.

3. The random access memory of claim 2, further wherein the second magnetic field is adapted to counteract an effect on a non-selected bit cell of the corresponding write conductor due to a stray portion of a magnetic field of a neighboring write conductor of a selected bit cell.

4. The random access memory of claim 3, still further wherein the second magnetic field is oriented in a direction opposite to that of the magnetic field of the neighboring write conductor of the selected bit cell.

5. The random access memory of claim 1, wherein the disturb counteracting current is a reverse current of a portion of the write current.

6. The random access memory of claim 5, further wherein the disturb counteracting current does not in itself lead to disturbing of bit cells of other neighboring write conductors.

7. The random access memory of claim 1, wherein switching the disturb counteracting current includes selectively switching the disturb counteracting current onto the corresponding write conductor.

8. The random access memory of claim 1, wherein the recycled portion of the write current is substantially equally divided among the plurality of write conductors minus one.

9. The random access memory of claim 1, further comprising:

a current redistribution bus coupled to second ends of corresponding ones of the plurality of the write conductors, said current redistribution bus for redistributing the write current of a first write conductor into at least one disturb counteracting current to be distributed among at least one of the plurality of write conductors other than the first write conductor.

10. The random access memory of claim 9, wherein redistributing the write current further includes redistributing the same as a function of a proximity to the first write conductor.

11. The random access memory of claim 9, wherein redistributing among at least one of the plurality of write conductors other than the first write conductor is further a function of a desired counteracting effect on the stray portion of the magnetic field.

12. The random access memory of claim 9, wherein the redistribution is still further a function of at least one selected from the group consisting of immediately adjacent write conductors of non-selected bit cells alone, even numbered ones of adjacent write conductors of non-selected bit cells, and odd numbered ones of adjacent write conductors of non-selected bit cells.

13. The random access memory of claim 1, wherein the at least one write driver further includes a first switch and a second switch, the first switch for switching the write current onto the corresponding write conductor in response to the selection of the bit cell of the corresponding write conductor, and the second switch for coupling the disturb counteracting current to a same corresponding write conductor in response to non-selection of a bit cell associated with the corresponding write conductor.

14. The random access memory of claim 13, further wherein a state of the first switch is mutually exclusive of a state of the second switch.

15. The random access memory of claim 13, further wherein a state of the first switch is normally ON, and still further wherein responsive to selection of a bit cell on a respective write conductor, the first switch turns OFF and the second switch turns ON.

16. The random access memory of claim 1, wherein the write current of the write conductor of the selected bit cell is divided between a subset of write conductors of non-selected bit cells.

17. The random access memory of claim 13, further wherein the first switch includes a current controlled switch that comprises of a NAND gate coupled to an input of a current mirror, still further wherein the first switch couples a first power supply voltage to a corresponding write conductor.

18. The random access memory of claim 17, further wherein the second switch includes an inverter coupled to a p-type transistor, still further wherein the second switch couples a second voltage power supply to the corresponding write conductor.

19. The random access memory of claim 18, wherein the first power supply voltage corresponds to a lower voltage potential bus $V_{SS}$ and the second power supply voltage corresponds to a higher voltage potential bus $V_{DD}$.

20. The random access memory of claim 1, wherein the bit cells include magnetoresistive memory cells.

21. A method of reducing write field disturb in a random access memory of magnetic elements, the random access memory including an array of bit cells, an array of write conductors for use in writing to a selected bit cell of the array of bit cells, wherein a write current applied to a write conductor of a selected bit cell is subject to producing a magnetic field about a corresponding write conductor, the magnetic field including a stray portion thereof subject to disturbing a non-selected bit cell of a neighboring write conductor, and a plurality of write drivers, said method comprising:

coupling the plurality of write drivers to first ends of corresponding ones of the plurality of write conductors; and configuring at least one write driver for: (a) switching a write current onto a corresponding write conductor in response to selection of a bit cell of the corresponding write conductor and (b) switching a disturb counteracting current onto the corresponding write conductor in response to non-selection of a bit cell associated with the corresponding write conductor, wherein switching the disturb counteracting current includes recycling a portion of the write current of a neighboring write conductor of a selected bit cell.

22. The method of claim 21, further comprising:

producing a second magnetic field about the corresponding write conductor in response to the disturb counteracting current.

23. The method of claim 22, further comprising:

adapting the second magnetic field to counteract an effect on a non-selected bit cell of the corresponding write conductor due to a stray portion of a magnetic field of a neighboring write conductor of a selected bit cell.

24. The method of claim 21, wherein the disturb counteracting current is a reverse current of a portion of the write current.

25. The method of claim 21, wherein switching the disturb counteracting current includes selectively switching the disturb counteracting current onto the corresponding write conductor.

26. The method of claim 21, further comprising:

substantially equally dividing a recycled portion of the write current among the plurality of write conductors minus one.

27. The method of claim 21, further comprising:

coupling a current redistribution bus to second ends of corresponding ones of the plurality of the write conductors, the current redistribution bus for redistributing the write current of a first write conductor into at least one disturb counteracting current to be distributed among at least one of the plurality of write conductors other than the first write conductor.

28. The method of claim 27, wherein redistributing the write current further includes redistributing the same as a function of a proximity to the first write conductor.

29. The method of claim 27, wherein redistributing among at least one of the plurality of write conductors other than the first write conductor is further a function of a desired counteracting effect on the stray portion of the magnetic field.

30. The method of claim 21, further comprising:

dividing the write current of the write conductor of the selected bit cell between a subset of write conductors of the non-selected bit cells.

31. The method of claim 21, wherein the bit cells include magnetoresistive memory cells.

* * * * *